United States Patent
Chih et al.

(10) Patent No.: US 6,396,740 B1
(45) Date of Patent: May 28, 2002

(54) REFERENCE CELL CIRCUIT FOR SPLIT GATE FLASH MEMORY

(75) Inventors: Yue-Der Chih, Hsin-Chu; Ching-Huang Wang, Pinchen; Cheng-Hsiung Kuo, Tainon, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/928,051

(22) Filed: Aug. 10, 2001

(51) Int. Cl.[7] .............................................. G11C 16/06
(52) U.S. Cl. ..................................... 365/185.2; 365/210
(58) Field of Search ............................... 365/185.2, 210, 365/185.18

(56) References Cited

U.S. PATENT DOCUMENTS 5,450,361 A * 9/1995 Iwahashi et al. ............. 365/210
5,684,739 A * 11/1997 Takeuchi .................. 365/185.2
6,275,419 B1 * 8/2001 Guterman et al. ...... 365/185.18
6,317,362 B1 * 11/2001 Nomura et al. .......... 365/185.2

* cited by examiner

Primary Examiner—Son Mai
(74) Attorney, Agent, or Firm—Randy W. Tung

(57) ABSTRACT

A reference cell circuit 50 for split gate flash memory. The reference cell circuit 50 includes an odd split gate cell 52 and an even split gate cell 54. The control gate 56 of the odd cell 52 is coupled to an address bit line XADR[0], and the control gate 64 of the even gate cell is coupled to the output of an inverter 66 which inverts the signal from XADR[0]. The floating gates 58, 68 of the odd cell 52 and even cell 54 are each coupled to a constant voltage signal Vdd. By placing signals on line XADR[0], cells 52, 54 may be selectively activated and deactivated.

18 Claims, 1 Drawing Sheet

US 6,396,740 B1

REFERENCE CELL CIRCUIT FOR SPLIT GATE FLASH MEMORY

FIELD OF THE INVENTION

This invention relates to a reference cell circuit and more particularly, to a split gate reference cell circuit which may be quickly accessed and which has improved tracking attributes relative to prior reference cell circuits.

BACKGROUND OF THE INVENTION

Semiconductor memory devices typically employ reference cell circuits to access data stored within selected portions of memory by way of one or more bit lines. One type of reference cell circuit implements "split gate flash" type memory cells to access portions of memory. Referring now to FIG. 1, there is shown a schematic diagram illustrating a conventional split gate flash type reference cell circuit 10. Circuit 10 includes a pair of split gate type field effect transistors or flash memory cells 12, 14. Cell 12 represents an odd reference cell, and cell 14 represents an even reference cell. Cell 12 includes a control gate 16 which is electrically and communicatively coupled to address bit line XADR[0], a floating gate 18 which is electrically coupled to the control gate 16, a drain 20 and a source 22. Cell 14 includes a control gate 24 which is electrically and communicatively connected to a conventional logic inverter device 26. Inverter device 26 is electrically and communicatively coupled to address bit XADR[0] and to control gate 24. Cell 14 further includes a floating gate 28, which is electrically coupled to the control gate 24, a drain 30 which is electrically and communicatively coupled to drain 20, and a source 32 which is electrically and communicatively coupled to source 22. Based on the control signal received from XADR[0], the control and floating gates for the selected cells 12, 14 are selectively activated and deactivated. Particularly, when the control gate 16 and floating gate 18 are activated for cell 12, the control gate 24 and floating gate 28 are deactivated for cell 14, and when the control gate 24 and floating gate 28 are activated for cell 14, the control gate 16 and floating gate 18 are deactivated for cell 12. While this reference cell circuit 10 is effective to select between the even cell 12 and odd cell 14 and has acceptable tracking attributes (e.g., tracking of process variation), it suffers from some drawbacks.

Particularly, the floating gates 24, 28 of the reference cell circuit 10 have relatively high resistance values, and require an undesirable long period of time to for the reference currents to build and for the cells 12, 14 to reach their respective threshold or "turn-on" voltages. As a result, the access time of the reference circuit 10 is undesirably long (e.g., 200 nanoseconds).

There is therefore a need for a new and improved reference cell circuit or split gate flash memory having a reduced access time relative prior reference cell circuits, while maintaining and/or improving the tracking attributes of the circuit.

SUMMARY OF THE INVENTION

A first non-limiting advantage of the invention is that it provides a reference cell circuit for split gate flash memory which has a reduced access time.

A second non-limiting advantage of the invention is that it provides a method for selecting between split gate type reference cells which has allows for improved tracking of process variation.

According to a first aspect of the present invention, a reference cell circuit is provided for split gate flash memory. The circuit includes a bit line which provides a first signal; an inverter which is coupled to the bit line and which inverts the first signal; a first split gate cell having a first control gate which is electrically coupled to the address line and which receives the first signal, effective to select the first split gate cell when the first signal is high, a first floating gate which is electrically coupled to a constant voltage signal, a first source and a first drain; and a second split gate cell having a second control gate which is electrically coupled to the inverter and which receives the inverted first signal, effective to select the second split gate cell when the first signal is low, a second floating gate which is electrically coupled to the constant voltage signal, a second source, and a second drain.

According to a second aspect of the present invention, a reference cell circuit is provided for split gate flash memory. The circuit includes a bit line which provides a first signal; an inverter which is electrically coupled to the bit line and which inverts the first signal; a first split gate transistor having a first control gate which is electrically coupled to a constant voltage signal, a first floating gate which is electrically coupled to the first control gate and to the constant voltage signal; a second split gate transistor having a second control gate which is electrically coupled to the constant voltage signal, a second floating gate which is electrically coupled to to the second control gate and to the constant voltage signal; a third transistor having a first gate which is coupled to the bit line and which receives the first signal, and a first portion which is coupled to first split gate transistor, effective to select the first split gate transistor when the first signal is high; and a fourth transistor having a fourth gate which is coupled to the inverter and which receives the inverted first signal, and a second portion which is coupled to the second split gate transistor, effective to select the second split gate transistor when the first signal is low.

According to a third aspect of the present invention, a method is provided for selecting between an odd split gate flash memory cell and an even split gate flash memory cell, the odd split gate memory cell including a first control gate and a first floating gate, and the even split gate memory cell comprising a second control gate and a second floating gate, the method comprising the steps of: coupling the first floating gate and the second floating gate to a constant voltage source; communicating a first signal to the first control gate, effective to activate the first control gate when the first signal is high, thereby selecting the odd split gate memory cell, and effective to deactivate the first control gate when the first signal is low, thereby deselecting the odd split gate memory cell; inverting the first signal; and communicating the inverted first signal to the second control gate, effective to deactivate the second control gate when the first signal is high, thereby deselecting the even split gate memory cell, and effective to activate the second control gate when the first signal is low, thereby selecting the even split gate memory cell.

These and other features, advantages, and objects of the invention will become apparent by reference to the following specification and by reference to the following drawings.

DETAILED DESCRIPTION OF THE PREFERRED EMBODIMENT OF THE INVENTION

Figure 1:
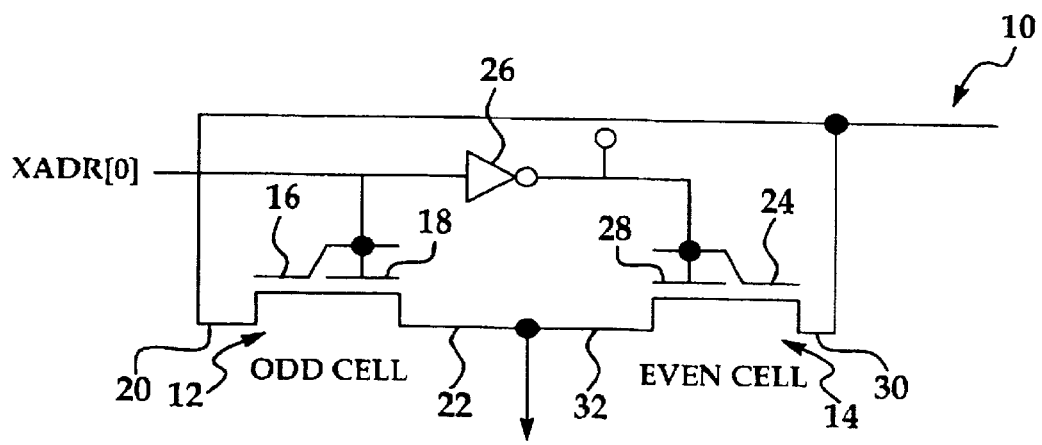
FIG. 1 is a schematic diagram illustrating a reference cell circuit for split gate flash memory which is made in accordance with the teachings of the prior art.
Figure 2:
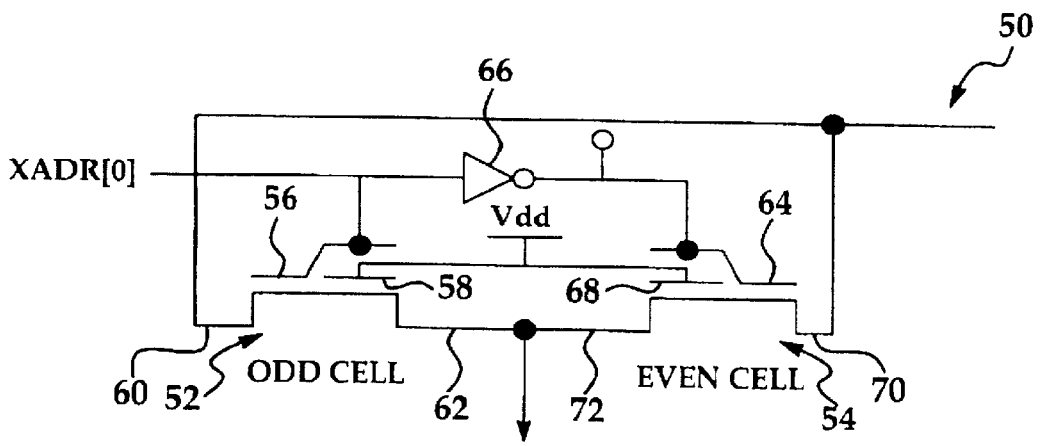
FIG. 2 is a schematic diagram illustrating a reference cell circuit for split gate flash memory which is made in accordance with the teachings of a first embodiment of the present invention.

Referring now to FIG. 2, there is shown a reference cell circuit 50 that is made in accordance with the teachings of a first embodiment of the present invention and which is adapted for use within a conventional semiconductor integrated circuit device. It should be appreciated by one of ordinary skill in the art that a semiconductor integrated circuit device may employ several substantially identical circuits 50 in a cooperative manner to if perform various conventional memory functions.

Circuit 50 includes a pair of conventional split gate type field effect transistors or cells 52, 54, such as metal-oxide-semiconductor ("MOS") transistors. Cell 52 represents an odd reference cell, and cell 54 represents an even reference cell. Cell 52 includes a control gate 56 which is electrically and communicatively coupled to address bit line XADR[0], a floating gate 58, a drain 60 and a source 62. Cell 56 includes a control gate 64 which is electrically and communicatively connected to the output of conventional logic inverter device 66. The input of inverter device 66 is electrically and communicatively coupled to address bit line XADR[0]. Cell 54, further includes a floating gate 68, a drain 70 which is electrically and communicatively coupled to drain 60, and a source 72 which is electrically and communicatively coupled to source 62. Both floating gate 58 and floating gate 68 are electrically and communicatively coupled to a constant voltage supply Vdd (or Vcc). Moreover, it should be noted that unlike prior art cells 12, 14, the floating gates 58, 68 of cells 52, 54 are not electrically coupled to control gates 56, 64.

In operation, the cells 52, 54 may be selectively activated based on the control signal received from XADR[0]. Particularly, the control and floating gates for the A selected/deselected cells 52, 54 are selectively activated and deactivated based on the value of the signal received from XADR [0]. That is, a relatively "high" signal or voltage value (i.e., a signal representing a positive logic value) received from XADR[0] will activate control gate 56, thereby selecting odd cell 52, while concomitantly deactivating control gate 64 and deselecting cell 54, and a relatively "low" signal or voltage (i.e., a signal representing a negative logic value) from XADR[0] will activate control gate 64 (due to inverter 66), thereby selecting even cell 54, while concomitantly deactivating control gate 56 and deselecting cell 52.

Due to the relatively low resistance of control gates 56, 64, the reference currents and electrical coupling of floating gates 58, 68 to a constant voltage Vdd, the reference currents of cells 52, 54 are built up relatively short time. As a result, access time is substantially and desirably decreased and tracking of process variation is improved.

Figure 3:
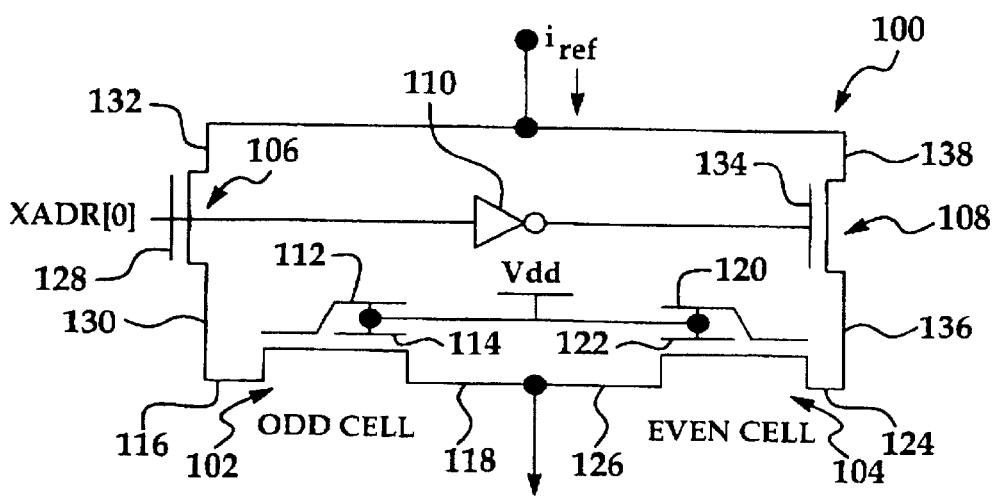
FIG. 3 is a schematic diagram illustrating a reference cell circuit for split gate flash memory which is made in accordance with the teachings of a second embodiment of the present invention.

Referring now to FIG. 3, there is shown a reference cell circuit 100 that is made in accordance with the teachings of a second embodiment of the present invention and which is adapted for use within a conventional semiconductor integrated circuit device. Circuit 100 includes a pair of conventional split gate type field effect transistors or cells 102, 104 (e.g., MOS transistors), a pair of conventional field effect transistors 106, 108 (e.g., MOS transistors), and a conventional logic inverter device 110. Cell 102 represents an odd reference cell, and cell 104 represents an even reference cell. Cell 102 includes a control gate 112, a floating gate 114, a drain 116 and a source 118. Control gate 112 and floating gate 114 are electrically coupled together and are each electrically and communicatively coupled to a constant voltage signal or source Vdd (or Vcc). Cell 104 includes a control gate 120, a floating gate 122, a drain 124 and a source 126. Control gate 120 and floating gate 122 are electrically coupled together and are each electrically and communicatively coupled to a constant voltage signal which is denoted as Vdd.

Field effect transistor 106 includes a gate 128 which is coupled to bit line XADR[0], a source 130, and a drain 132. Field effect transistor 108 includes a gate 134 which is coupled to the output of logic inverter device 110, a source 136 and a drain 138. The input of logic inverter device 110 is coupled to XADR[0]. Drain 132 and drain 138 are communicatively and electrically coupled together, source 130 is communicatively and electrically coupled to drain 116 and source 136 is communicatively and electrically coupled to drain 124.

In operation, the cells 102, 104 may be selectively activated/deactivated based on the control signal received from XADR[0]. Particularly, in order to activate the odd cell 102, a relatively "high" signal or voltage (i.e., a signal representing a positive logic value) is placed on the bit line XADR[0] and gate 128. This will create a channel within the transistor 106 and will allow current to travel from the drain 132 to the source 130 of transistor 106, and into cell 102, thereby selecting cell 102. Concomitantly, this relatively "high" signal will be inverted by element 110, thereby placing a relatively "low" signal or voltage (i.e., a signal representing a negative logic value) on gate 134. As a result, substantially no current will flow from drain 138 to source 136 through transistor 108, and cell 104 will remain deselected. Alternatively, when a relatively "low" voltage is placed on XADR[0], inverter 110 will cause a relatively "high" signal to be placed on gate 134. This will create a channel within the transistor 108 and will allow current to travel from the drain 138 to the source 140 of transistor 108, and into cell 104, thereby selecting cell 104. The low signal on line XADR[0] and gate 134, will also "turn off" transistor 106, thereby causing substantially no current to flow from drain 132 to source 130 through transistor 108, and cell 102 will be deselected.

Due to the relatively low resistance of control gates 128 and 134, the reference currents of cells 102, 104 may be achieved in a relatively short time. As a result, access time of the circuit 100 is substantially and desirably decreased and tracking of process variation is improved.

It should be understood that the inventions described herein are provided by way of example only and that numerous changes, alterations, modifications, and substitutions may be made without departing from the spirit and scope of the inventions as delineated within the following claims.

What is claimed is:

1. A reference cell circuit for split gate flash memory comprising:
   a bit line which provides a first signal;
   an inverter which is coupled to said bit line and which inverts said first signal;
   a first split gate cell having a first control gate which is electrically coupled to said bit line and which receives said first signal, effective to select said first split gate cell when said first signal is high, a first floating gate which is electrically coupled to a constant voltage signal, a first source and a first drain; and a second split gate cell having a second control gate which is electrically coupled to said inverter and which receives said inverted first signal, effective to select said second split gate cell when said first signal is low, a second floating gate which is electrically coupled to said constant voltage signal, a second source, and a second drain.

2. The reference cell circuit of claim 1 wherein said first drain is electrically coupled to said second drain.

3. The reference cell circuit of claim 2 wherein said first source is electrically coupled to said second source.

4. The reference cell circuit of claim 1 wherein said first split gate cell comprises an odd cell and said second split gate cell comprises an even cell.

5. The reference cell circuit of claim 1 wherein said first and second split gate cells comprise metal-oxide-semiconductor transistors.

6. A reference cell circuit for split gate flash memory comprising:

a bit line which provides a first signal;

an inverter which is electrically coupled to said bit line and which inverts said first signal;

a first split gate transistor having a first control gate which is electrically coupled to a constant voltage signal, a first floating gate which is electrically coupled to said first control gate and to said constant voltage signal;

a second split gate transistor having a second control gate which is electrically coupled to said constant voltage signal, a second floating gate which is electrically coupled to said second control gate and to said constant voltage signal;

a third transistor having a first gate which is coupled to said bit line and which receives said first signal, and a first portion which is coupled to first split gate transistor, effective to select said first split gate transistor when said first signal is high; and a fourth transistor having a fourth gate which is coupled to said inverter and which receives said inverted first signal, and a second portion which is coupled to said second split gate transistor, effective to select said second split gate transistor when said first signal is low.

7. The reference cell circuit of claim 6 wherein said first split gate transistor represents an odd cell and said second split gate transistor represents an even cell.

8. The reference cell circuit of claim 6 wherein said first split gate transistor comprises a first source and wherein said second split gate transistor comprises a second source which is coupled to said first source.

9. The reference cell circuit of claim 8 wherein said first split gate transistor comprises a first drain, said second split gate transistor comprises a second drain, said third transistor comprises a third source which is coupled to said first drain and said fourth transistor comprises a fourth source which is coupled to said second drain.

10. The reference cell circuit of claim 9 wherein said third transistor further comprises a third drain, and said fourth transistor further comprises a fourth drain which is coupled to said third drain.

11. The reference cell circuit of claim 6 wherein said first and said second split gate transistors comprise metal-oxide-semiconductor transistors.

12. The reference cell circuit of claim 6 wherein said third and fourth transistors comprise metal-oxide-semiconductor transistors.

13. A method for selecting between an odd split gate flash memory cell and an even split gate flash memory cell, said odd split gate memory cell including a first control gate and a first floating gate, and said even split gate memory cell comprising a second control gate and a second floating gate, said method comprising the steps of:

coupling said first floating gate and said second floating gate to a constant voltage source;

communicating a first signal to said first control gate, effective to activate said first control gate when said first signal is high, thereby selecting said odd split gate memory cell, and effective to deactivate said first control gate when said first signal is low, thereby deselecting said odd split gate memory cell;

inverting said first signal; and communicating said inverted first signal to said second control gate, effective to deactivate said second control gate when said first signal is high, thereby deselecting said even split gate memory cell, and effective to activate said second control gate when said first signal is low, thereby selecting said even split gate memory cell.

14. The method of claim 13 wherein said step of providing a first signal to said first control gate comprises electrically coupling an address bit line to said first control gate.

15. The method of claim 14 wherein said steps of inverting said first signal and providing said inverted first signal to said second control gate comprises coupling an input of an inverter to said address line and coupling said second control gate to an output of said inverter.

16. The method of claim 13 wherein said first split gate memory cell further comprises a first source and said second split gate memory cell comprises a second source, said method further comprising the steps of coupling said first source to said second source.

17. The method of claim 16 wherein said first split gate memory cell further comprises a first drain and said second split gate memory cell comprises a second drain, said method further comprising the steps of coupling said first drain to said second drain.

18. The method of claim 13 wherein said first and second split gate cells comprise metal-oxide-semiconductor transistors.

* * * * *